(12) United States Patent
Sasaki et al.

(10) Patent No.: US 8,466,562 B2
(45) Date of Patent: Jun. 18, 2013

(54) LAYERED CHIP PACKAGE

(75) Inventors: Yoshitaka Sasaki, Milpitas, CA (US);
Hiroyuki Ito, Milpitas, CA (US);
Hiroshi Ikejima, Hong Kong (CN);
Atsushi Iijima, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 131 days.

(21) Appl. No.: 12/585,778

(22) Filed: Sep. 24, 2009

(65) Prior Publication Data

US 2011/0068456 A1 Mar. 24, 2011

(51) Int. Cl.
*H01L 23/48* (2006.01)

(52) U.S. Cl.
USPC ............... 257/777; 257/E23.174; 257/686

(58) Field of Classification Search
USPC ............ 257/750, 758, 692, 686, 777, 778, 257/774, 676, E23.174, E25.013, E23.142, 257/E23.037
See application file for complete search history.

(56) References Cited

U.S. PATENT DOCUMENTS

| | | | |
|---|---|---|---|
| 7,462,784 B2 * | 12/2008 | Kariya et al. | 174/260 |
| 7,759,716 B2 | 7/2010 | Baek et al. | |
| 7,902,674 B2 * | 3/2011 | Chang et al. | 257/777 |
| 2005/0040509 A1 * | 2/2005 | Kikuchi et al. | 257/686 |
| 2007/0165461 A1 | 7/2007 | Cornwell et al. | |
| 2008/0009124 A1 | 1/2008 | Ishino et al. | |
| 2008/0179728 A1 | 7/2008 | Ikeda | |

FOREIGN PATENT DOCUMENTS

| | | |
|---|---|---|
| JP | A-2004-281633 | 10/2004 |
| JP | A-2004-296812 | 10/2004 |
| JP | A-2008-16720 | 1/2008 |
| JP | A-2009-10390 | 1/2009 |

OTHER PUBLICATIONS

Japanese Office Action dated Oct. 27, 2011 for Japanese Patent Application No. 2010-088308 (with translation).

* cited by examiner

*Primary Examiner* — Hoa B Trinh
(74) *Attorney, Agent, or Firm* — Oliff & Berridge, PLC

(57) ABSTRACT

A layered chip package includes a plurality of layer portions that are stacked, each of the layer portions including a semiconductor chip. The plurality of layer portions include at least one first-type layer portion and at least one second-type layer portion. The semiconductor chip has a circuit, a plurality of electrode pads electrically connected to the circuit, and a plurality of through electrodes. In every vertically adjacent two of the layer portions, the plurality of through electrodes of the semiconductor chip of one of the two layer portions are electrically connected to the respective corresponding through electrodes of the semiconductor chip of the other of the two layer portions. The first-type layer portion includes a plurality of wires for electrically connecting the plurality of through electrodes to the respective corresponding electrode pads, whereas the second-type layer portion does not include the wires.

5 Claims, 15 Drawing Sheets

LAYERED CHIP PACKAGE

BACKGROUND OF THE INVENTION

1. Field of the Invention

The present invention relates to a layered chip package that includes a plurality of chips stacked and a method of manufacturing the same.

2. Description of the Related Art

In recent years, a reduction in weight and an improvement in performance have been demanded of mobile devices typified by cellular phones and notebook personal computers. Accordingly, there has been a demand for higher integration of electronic components for use in mobile devices. Higher integration of electronic components has been demanded also for achieving an increase in capacity of semiconductor memory.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package that includes a plurality of semiconductor chips (hereinafter, also simply referred to as chips) stacked is called a layered chip package. Since the layered chip package allows a reduction in wiring length, it provides the advantage of allowing a higher operation speed for circuits and a reduction in stray capacitance of wiring, as well as the dvantage of allowing higher integration.

Major examples of the three-dimensional packaging technology for fabricating a layered chip package include a wire bonding method and a through electrode method. According to the wire bonding method, a plurality of chips are stacked on a substrate, and a plurality of electrodes formed on each chip are connected to external connecting terminals formed on the substrate by wire bonding. According to the through electrode method, a plurality of through electrodes are formed in each of the chips to be stacked and inter-chip wiring is performed through the use of the through electrodes. U.S. Patent Application Publication No. US 2008/0179728 A1 describes a laminated memory formed using the through electrode method.

The wire bonding method has the problem that it is difficult to reduce the distance between the electrodes so as to avoid contact between wires, and the problem that the high resistances of the wires hinder the acceleration of operation of circuits. The through electrode method is free from the problems of the wire bonding method.

For a wafer to be cut into a plurality of chips, the yield of the chips, that is, the rate of conforming chips with respect to all chips obtained from the wafer, is 90% to 99% in many cases. Since a layered chip package includes a plurality of chips, the rate of layered chip packages in which all of the plurality of chips are conforming ones is lower than the yield of the chips. The larger the number of chips included in each layered chip package, the lower the rate of layered chip packages in which all of the chips are conforming ones.

A case will now be considered where a memory device such as a flash memory is formed using a layered chip package. For a memory device such as a flash memory, a redundancy technique of replacing a defective column of memory cells with a redundant column of memory cells is typically employed so that the memory device can normally function even when some memory cells are defective. In the case where a memory device is formed using a layered chip package, the redundancy technique is also employable to make it possible that, even if some of memory cells included in any chip are defective, the memory device can normally function while using the chip including the defective memory cells. Assume, however, that a chip including a control circuit and a plurality of memory cells has become defective due to, for example, a wiring failure of the control circuit, and it does not function normally even by employing the redundancy technique. In such a case, the defective chip is no longer usable. While the defective chip can be replaced with a conforming one, it increases the cost for the layered chip package.

US 2007/0165461 A1 discloses a technique of identifying one or more defective flash memory dies in a flash memory device having a plurality of flash memory dies, and disabling memory access operations to each identified die.

The technique disclosed in US 2007/0165461 A1 is applicable to the case where a memory device is formed using a layered chip package, so that one or more defective chips included in the layered chip package can be identified and disabled.

In the case of a layered chip package formed using the through electrode method, however, disabling a defective chip produces the following problem. In the layered chip package formed using the through electrode method, the circuit in each chip is electrically connected to a plurality of through electrodes that are formed in the chip. In every two vertically adjacent chips, the plurality of through electrodes of one of the two chips are electrically connected to the respective corresponding through electrodes of the other of the two chips. The circuit in each chip is then electrically connected to a plurality of external terminals of the layered chip package via the plurality of through electrodes of one or more chips. Even if a defective chip is disabled in such a layered chip package, the circuit in the defective chip is still electrically connected to the plurality of external terminals of the layered chip package. In such a case, the circuit in the defective chip can produce capacitances and inductances that are unnecessary for a device to be implemented by the layered chip package, such as a memory device. This hinders the acceleration of operation of the device such as a memory device.

OBJECT AND SUMMARY OF THE INVENTION

It is an object of the present invention to provide a layered chip package and a method of manufacturing the same, the layered chip package including a plurality of chips stacked and being capable of disabling the use of a malfunctioning chip while reducing the problems attributable to the circuit in the malfunctioning chip.

A layered chip package according to the present invention includes a plurality of layer portions that are stacked, each of the plurality of layer portions including a semiconductor chip. The plurality of layer portions include at least one first-type layer portion and at least one second-type layer portion. The semiconductor chip has a circuit, a plurality of electrode pads electrically connected to the circuit, and a plurality of through electrodes. In every vertically adjacent two of the layer portions, the plurality of through electrodes of the semiconductor chip of one of the two layer portions are electrically connected to the respective corresponding through electrodes of the semiconductor chip of the other of the two layer portions. The first-type layer portion includes a plurality of wires for electrically connecting the plurality of through electrodes to the respective corresponding electrode pads, whereas the second-type layer portion does not include the wires.

In the layered chip package according to the present invention, the semiconductor chip of the first-type layer portion may be a normally functioning one whereas the semiconductor chip of the second-type layer portion may be a malfunctioning one.

In the layered chip package according to the present invention, the semiconductor chip may further have a plurality of auxiliary pads that are electrically connected to the respective corresponding through electrodes, and the plurality of wires may be electrically and physically connected to the respective corresponding auxiliary pads. In this case, the semiconductor chip may further have a plurality of second auxiliary pads that are electrically connected to the respective corresponding electrode pads, and the plurality of wires may be electrically and physically connected to the respective corresponding second auxiliary pads. The second-type layer portion may include a plurality of connecting parts that are not electrically connected to the plurality of electrode pads but are connected to the respective corresponding auxiliary pads electrically and physically, the connecting parts being used for electrically connecting the through electrodes of the semiconductor chip of one of two vertically adjacent layer portions to the respective corresponding through electrodes of the semiconductor chip of the other of the two vertically adjacent layer portions.

A layered chip package manufactured by a manufacturing method according to the present invention includes a plurality of layer portions that are stacked, each of the plurality of layer portions including a semiconductor chip. The plurality of layer portions include at least one first-type layer portion and at least one second-type layer portion. The semiconductor chip has a circuit, a plurality of electrode pads electrically connected to the circuit, and a plurality of through electrodes. The semiconductor chip of the first-type layer portion is a normally functioning one whereas the semiconductor chip of the second-type layer portion is a malfunctioning one. In every vertically adjacent two of the layer portions, the plurality of through electrodes of the semiconductor chip of one of the two layer portions are electrically connected to the respective corresponding through electrodes of the semiconductor chip of the other of the two layer portions. The first-type layer portion includes a plurality of wires for electrically connecting the plurality of through electrodes to the respective corresponding electrode pads, whereas the second-type layer portion does not include the wires.

The manufacturing method for the layered chip package according to the present invention includes the steps of: fabricating a plurality of substructures each of which includes a plurality of preliminary layer portions arrayed, each of the preliminary layer portions being intended to be made into any one of the plurality of layer portions, the substructures being intended to be cut later at the position of the boundary between every adjacent two of the preliminary layer portions; and fabricating the layered chip package by using the plurality of substructures.

The step of fabricating the plurality of substructures includes the steps of: fabricating a pre-substructure wafer that includes a plurality of pre-semiconductor-chip portions arrayed; distinguishing the plurality of pre-semiconductor-chip portions included in the pre-substructure wafer into normally functioning pre-semiconductor-chip portions and malfunctioning pre-semiconductor-chip portions; and forming the plurality of wires in the normally functioning pre-semiconductor-chip portions while not forming the plurality of wires in the malfunctioning pre-semiconductor-chip portions, so as to make the pre-substructure wafer into one substructure.

In the manufacturing method for the layered chip package according to the present invention, the distinguishing step may be performed with a probe of a testing device brought into contact with the plurality of electrode pads.

In the manufacturing method for the layered chip package according to the present invention, the semiconductor chip may further have a plurality of auxiliary pads that are electrically connected to the respective corresponding through electrodes, and the plurality of wires may be electrically and physically connected to the respective corresponding auxiliary pads. In this case, the step of forming the plurality of wires may include the steps of: forming a photoresist layer that is intended to be used for forming the plurality of wires per pre-semiconductor-chip portion and includes a plurality of areas corresponding to all the pre-semiconductor-chip portions; forming a frame by patterning the photoresist layer by photolithography, the frame having a plurality of openings for the wires to accommodate the plurality of wires later, the openings for the wires being formed in areas of the photoresist layer that correspond to the normally functioning pre-semiconductor-chip portions; and forming the plurality of wires so that they are accommodated in the plurality of openings for the wires in the frame. The semiconductor chip may further have a plurality of second auxiliary pads that are electrically connected to the respective corresponding electrode pads, and the plurality of wires may be electrically and physically connected to the respective corresponding second auxiliary pads. The second-type layer portion may include a plurality of connecting parts that are not electrically connected to the plurality of electrode pads but are connected to the respective corresponding auxiliary pads electrically and physically, the connecting parts being used for electrically connecting the through electrodes of the semiconductor chip of one of two vertically adjacent layer portions to the respective corresponding through electrodes of the semiconductor chip of the other of the two vertically adjacent layer portions. In this case, the step of forming the frame may include forming a plurality of openings for the connecting parts in areas of the photoresist layer that correspond to the malfunctioning pre-semiconductor-chip portions, the openings for the connecting parts being intended to accommodate the plurality of connecting parts later. The step of fabricating the substructures may further include the step of forming the plurality of connecting parts so that they are accommodated in the plurality of openings for the connecting parts in the frame.

In the manufacturing method for the layered chip package according to the present invention, the step of fabricating the layered chip package may include the steps of: fabricating a layered substructure by stacking the plurality of substructures; and cutting the layered substructure at the position of the boundary between every adjacent two of the preliminary layer portions in each substructure. In this case, the step of fabricating the layered chip package may further include the step of stacking at least one additional first-type layer portion together with a stack obtained by cutting the layered substructure, the number of the at least one additional first-type layer portion being equal to the number of the second-type layer portions included in the stack.

According to the layered chip package or its manufacturing method of the present invention, it is possible to disable the use of a malfunctioning chip while reducing the problems attributable to the circuit in the malfunctioning chip.

Other and further objects, features and advantages of the present invention will appear more fully from the following description.

DETAILED DESCRIPTION OF THE PREFERRED EMBODIMENTS

[First Embodiment]

Figure 1:
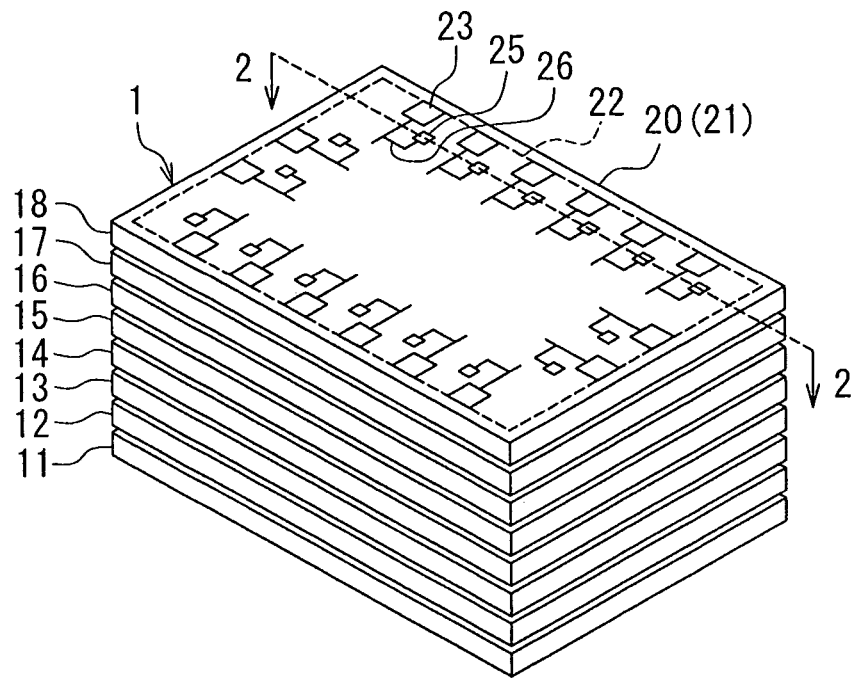
FIG. 1 is a perspective view of a layered chip package according to a first embodiment of the invention.
Figure 2:
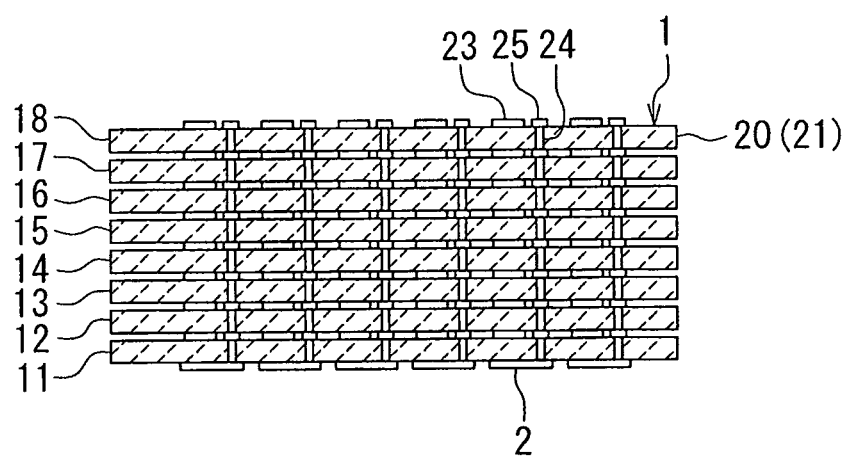
FIG. 2 shows a cross section taken along line 2-2 of FIG. 1.

Preferred embodiments of the present invention will now be described in detail with reference to the drawings. Reference is first made to FIG. 1 and FIG. 2 to describe the configuration of a layered chip package according to a first embodiment of the invention. FIG. 1 is a perspective view of the layered chip package according to the present embodiment. FIG. 2 shows a cross section taken along line 2-2 of FIG. 1.

As shown in FIG. 1 and FIG. 2, the layered chip package 1 according to the present embodiment includes a plurality of layer portions stacked. Each of the layer portions includes a semiconductor chip 20. By way of example, FIG. 1 and FIG. 2 show a case where the layered chip package 1 includes eight layer portions 11, 12, 13, 14, 15, 16, 17 and 18 which are stacked in this order from the bottom. The number of layer portions to be included in the layered chip package 1 is not limited to eight, however, and may be any number that is no smaller than two. In the following description, any layer portion will be generally designated by reference numeral 10. The layer portions 10 and the layered chip package 1 each generally have the shape of a rectangular solid.

The semiconductor chip 20 has: a chip body 21 including a circuit 22; a plurality of electrode pads 23 electrically connected to the circuit 22; a plurality of through electrodes 24; and a plurality of auxiliary pads 25 electrically connected to the respective corresponding through electrodes 24. The electrode pads 23, the through electrodes 24, and the auxiliary pads 25 are all made of metal. The chip body 21 has a top surface and a bottom surface that face toward opposite directions. The plurality of electrode pads 23 and the plurality of auxiliary pads 25 are arranged on the top surface of the chip body 21. The electrode pads 23 and the auxiliary pads 25 are provided in the same numbers and have a one-to-one correspondence therebetween. In every two vertically adjacent layer portions 10, the plurality of through electrodes 24 of the semiconductor chip 20 of one of the two layer portions 10 are electrically connected to the respective corresponding through electrodes 24 of the semiconductor chip 20 of the other of the two layer portions 10.

The layered chip package 1 further includes a plurality of external terminals 2 that are bonded to the bottom surface of the chip body 21 of the lowermost layer portion 11. The plurality of external terminals 2 are electrically connected to the respective corresponding through electrodes 24 of the lowermost layer portion 11. The external terminals 2 are made of metal. The layered chip package 1 may further include an insulating layer that covers the top surface of the uppermost layer portion 18.

The plurality of layer portions 10 include at least one first-type layer portion and at least one second-type layer portion. In the following description, the first-type layer portion will be designated by reference symbol 10A, and the second-type layer portion will be designated by reference symbol 10B. The semiconductor chip 20 of the first-type layer portion 10A is a normally functioning one, whereas the semiconductor chip 20 of the second-type layer portion 10B is a malfunctioning one. Hereinafter, a normally functioning semiconductor chip 20 will be referred to as a conforming semiconductor chip 20, and a malfunctioning semiconductor chip 20 will be referred to as a defective semiconductor chip 20.

The first-type layer portion 10A includes a plurality of wires 26 (see FIG. 1) for electrically connecting the plurality of through electrodes 24 to the respective corresponding electrode pads 23, whereas the second-type layer portion 10B does not include the plurality of wires 26. In the second-type layer portion 10B, the plurality of through electrodes 24 are therefore electrically connected to neither the circuit 22 nor the plurality of electrode pads 23. Note that the wires 26 are omitted in FIG. 2. The second-type layer portion 10B includes a plurality of connecting parts. The plurality of connecting parts are not electrically connected to the plurality of electrode pads 23, but are connected to the respective corresponding auxiliary pads 25 electrically and physically. The plurality of connecting parts are used for electrically connecting the through electrodes 24 of the semiconductor chip 20 of one of two vertically adjacent layer portions 10 to the respective corresponding through electrodes 24 of the semiconductor chip 20 of the other of the two vertically adjacent layer portions 10. Note that the plurality of connecting parts are omitted in FIG. 1 and FIG. 2. The wires 26 and the connecting parts are both made of metal.

The circuit 22 is formed by, for example, subjecting one of the surfaces of a semiconductor wafer for use in fabricating a plurality of semiconductor chips 20 to a wafer process. The circuit 22 may be a circuit including a plurality of memory cells that constitute a memory such as a flash memory, DRAM, SRAM, MRAM, PROM, or FeRAM. In such a case, it is possible to implement a large-capacity memory through the use of the layered chip package 1 including a plurality of semiconductor chips 20. With the layered chip package 1 according to the present embodiment, it is also possible to easily implement a memory of various capacities such as 64 GB (gigabytes), 128 GB, and 256 GB, by changing the number of the semiconductor chips 20 to be included in the layered chip package 1.

The layered chip package 1 may include a plurality of semiconductor chips 20 having circuits 22 that constitute different types of memory. The layered chip package 1 may also include a semiconductor chip 20 having a circuit 22 that includes a plurality of memory cells, and a semiconductor chip 20 having a circuit 22 that controls writing and reading operations on/from the plurality of memory cells.

In the case where the circuit 22 includes a plurality of memory cells and where one or more of the memory cells are defective, the semiconductor chip 20 having such a circuit 22 is still conforming if it can function normally by employing the redundancy technique.

The circuit 22 is not limited to one that constitutes a memory, and may be one for use in implementing other devices such as CPUs, sensors, and driving circuits for sensors. The layered chip package 1 according to the present embodiment is particularly suitable for implementing an SiP.

Figure 3:
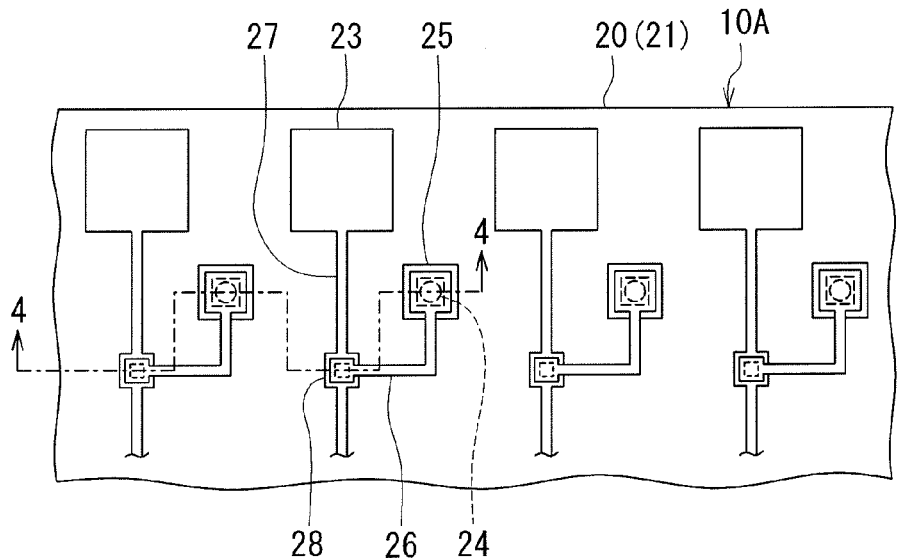
FIG. 3 is a plan view showing a part of a first-type layer portion of the first embodiment of the invention.
Figure 4:
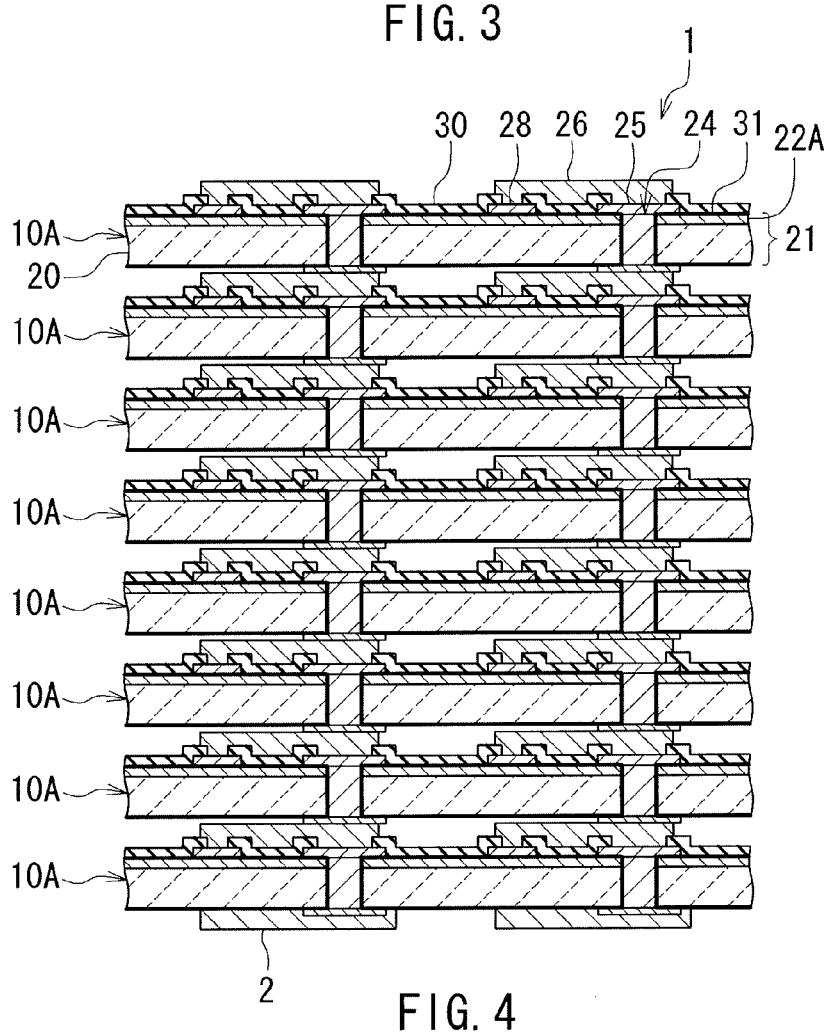
FIG. 4 is a cross-sectional view showing a part of a layered chip package that does not include any second-type layer portion.
Figure 5:
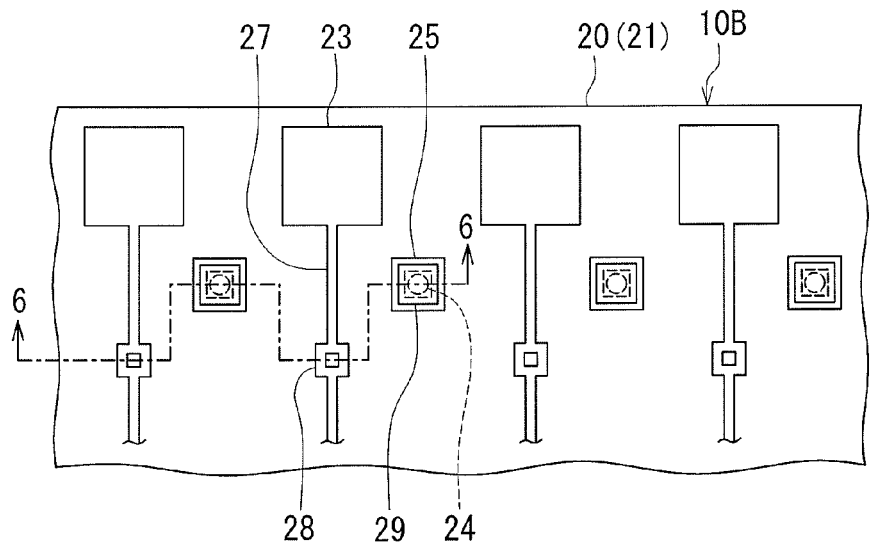
FIG. 5 is a plan view showing a part of a second-type layer portion of the first embodiment of the invention.
Figure 6:
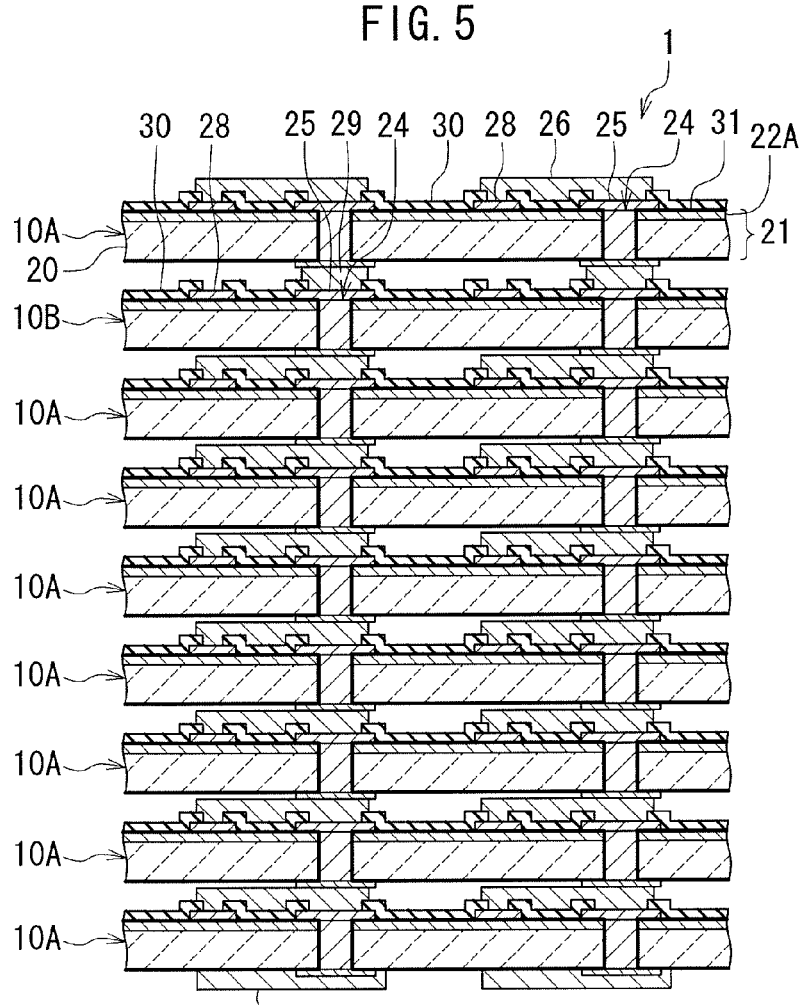
FIG. 6 is a cross-sectional view showing a part of a layered chip package that includes the first-type layer portion and the second-type layer portion.

A detailed description will now be given of the first-type layer portion 10A and the second-type layer portion 10B with reference to FIG. 3 to FIG. 6. FIG. 3 is a plan view showing a part of the first-type layer portion 10A. FIG. 4 is a cross-sectional view showing a part of a layered chip package 1 that does not include any second-type layer portion 10B. FIG. 5 is a plan view showing a part of the second-type layer portion 10B. FIG. 6 is a cross-sectional view showing a part of a layered chip package 1 that includes the first-type layer portion 10A and the second-type layer portion 10B.

As shown in FIG. 3 and FIG. 5, each semiconductor chip 20 has a plurality of leads 27 and a plurality of second auxiliary pads 28, in addition to the chip body 21, the plurality of electrode pads 23, the plurality of through electrodes 24 and the plurality of auxiliary pads 25. The plurality of leads 27 are electrically connected to the respective corresponding electrode pads 23, and are also electrically connected to the circuit 22. The plurality of second auxiliary pads 28 are arranged in the middle of the respective corresponding leads 27. Consequently, the plurality of second auxiliary pads 28 are electrically connected to the corresponding electrode pads 23 and the circuit 22 via the respective corresponding leads 27. The leads 27 and the second auxiliary pads 28 are both made of metal.

In the first-type layer portion 10A, as shown in FIG. 3 and FIG. 4, the plurality of wires 26 are connected to the respective corresponding auxiliary pads 25 electrically and physically, and are also connected to the respective corresponding second auxiliary pads 28 electrically and physically. Consequently, in the first-type layer portion 10A, the plurality of through electrodes 24 are electrically connected to the circuit 22 and the plurality of electrode pads 23 via the plurality of auxiliary pads 25, wires 26, second auxiliary pads 28, and leads 27.

FIG. 4 shows a cross section of the layered chip package 1 taken along line 4-4 of FIG. 3. The layered chip package 1 shown in FIG. 4 does not include any second-type layer portion 10B but includes eight first-type layer portions 10A. For the sake of convenience, FIG. 4 shows the wires 26 for connecting the auxiliary pads 25 and the second auxiliary pads 28 to each other as if they are continuous irrespective of the position of the line 4-4.

In the layered chip package 1 shown in FIG. 4, all the layer portions (the first-type layer portions 10A) are provided with the plurality of wires 26. In every two vertically adjacent layer portions 10A of this layered chip package 1, the plurality of through electrodes 24 of the semiconductor chip 20 of the lower layer portion 10A are electrically connected to the respective corresponding through electrodes 24 of the semiconductor chip 20 of the upper layer portion 10A via the corresponding auxiliary pads 25 and wires 26.

In FIG. 4 and FIG. 6, the layer designated by reference symbol 22A in the chip body 21 is a circuit layer where the circuit 22 is formed. The layer portions 10A and 10B each include an insulating film 30 disposed over the circuit layer 22A, the plurality of electrode pads 23, the plurality of auxiliary pads 25, the plurality of second auxiliary pads 28 and the plurality of leads 27. The insulating film 30 has a plurality of openings for exposing the top surfaces of the plurality of auxiliary pads 25, and a plurality of openings for exposing the top surfaces of the plurality of second auxiliary pads 28. In each layer portion 10A, the wires 26 are arranged on the insulating film 30 so that they are in contact with the top surfaces of the auxiliary pads 25 through the openings above the top surfaces of the auxiliary pads 25 and in contact with the top surfaces of the second auxiliary pads 28 through the openings above the top surfaces of the second auxiliary pads 28. Note that the insulating film 30 is omitted in FIG. 3.

As shown in FIG. 5 and FIG. 6, the second-type layer portion 10B does not include the plurality of wires 26 but includes a plurality of connecting parts 29 instead. In the second-type layer portion 10B, the plurality of through electrodes 24 are electrically connected to neither the circuit 22 nor the plurality of electrode pads 23. The plurality of connecting parts 29 are connected to the respective corresponding auxiliary pads 25 electrically and physically. The plurality of connecting parts 29 are used for electrically connecting the through electrodes 24 of the semiconductor chip 20 of one of two vertically adjacent layer portions 10 to the respective corresponding through electrodes 24 of the semiconductor chip 20 of the other of the two vertically adjacent layer portions 10.

The layered chip package 1 shown in FIG. 6 includes eight first-type layer portions 10A and one second-type layer portion 10B (the second layer portion from the top in FIG. 6). The cross section of the second-type layer portion 10B shown in FIG. 6 is taken along line 6-6 of FIG. 5. The cross section of the first-type layer portions 10A shown in FIG. 6 is taken along line 4-4 of FIG. 3. For the sake of convenience, FIG. 6 shows the wires 26 for connecting the auxiliary pads 25 and the second auxiliary pads 28 to each other as if they are continuous irrespective of the position of the line 4-4.

As shown in FIG. 6, the first-type layer portions 10A are each provided with the plurality of wires 26, whereas the second-type layer portion 10B is not. The second-type layer portion 10B is provided with the plurality of connecting parts 29 instead of the plurality of wires 26. In the layered chip package 1 shown in FIG. 6, the plurality of through electrodes 24 of the semiconductor chip 20 of the second-type layer portion 10B are electrically connected to the respective corresponding through electrodes 24 of the semiconductor chip 20 of the upper layer portion 10 via the corresponding auxiliary pads 25 and connecting parts 29. The plurality of through electrodes 24 of the semiconductor chip 20 of every first-type layer portion 10A except the uppermost layer portion 10 are electrically connected to the respective corresponding through electrodes 24 of the semiconductor chip 20 of the upper layer portion 10 via the corresponding auxiliary pads 25 and wires 26.

In the layer portion 10B, the connecting parts 29 are arranged on the insulating film 30 and are in contact with the top surfaces of the auxiliary pads 25 through the openings above the top surfaces of the auxiliary pads 25. Note that the insulating film 30 is omitted in FIG. 5.

Figure 7:
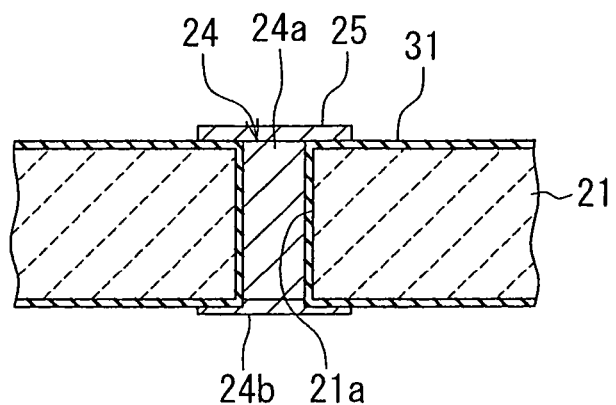
FIG. 7 is a cross-sectional view showing a through electrode and its periphery in a semiconductor chip.

With reference to FIG. 4, FIG. 6 and FIG. 7, a description will be given of the structure of each through electrode 24 and its periphery in the semiconductor chip 20. FIG. 7 is a cross-sectional view showing a through electrode 24 and its periphery. The chip body 21 has a plurality of holes 21a that pierce through the chip body 21 from the top surface to the bottom surface. FIG. 7 shows one of the plurality of holes 21a. The inner surface of the hole 21a and the top and bottom surfaces of the chip body 21 are covered with an insulating film 31. The through electrode 24 has a columnar conductor part 24a accommodated in the hole 21a, and a conductor film 24b bonded to the bottom end of the columnar conductor part 24a. The auxiliary pad 25 is bonded to the top end of the columnar conductor part 24a. As shown in FIG. 4, FIG. 6 and FIG. 7, the through electrode 24 and the auxiliary pad 25 are insulated from the chip body 21 by the insulating film 31.

Figure 8:
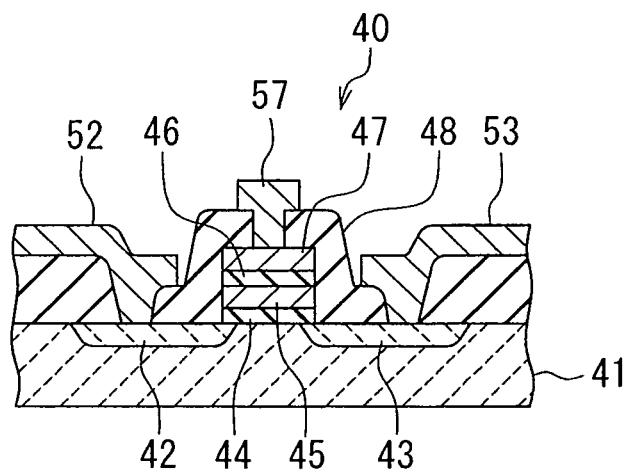
FIG. 8 is a cross-sectional view showing a part of the circuit of the semiconductor chip.

An example of the circuit 22 of the semiconductor chip 20 will now be described with reference to FIG. 8. FIG. 8 is a cross-sectional view showing a part of the circuit 22. By way of example, the following description will be given for a case where the circuit 22 includes a plurality of memory cells that constitute a memory. FIG. 8 shows one of the plurality of memory cells. The memory cell 40 includes a source 42 and a drain 43 formed near a surface of a P-type silicon substrate 41. The source 42 and the drain 43 are both N-type regions. The source 42 and the drain 43 are disposed at a predetermined distance from each other so that a channel composed of a part of the P-type silicon substrate 41 is provided between the source 42 and the drain 43. The memory cell 40 further includes an insulating film 44, a floating gate 45, an insulating film 46, and a control gate 47 that are stacked in this order on the surface of the substrate 41 at the location between the source 42 and the drain 43. The memory cell 40 further includes an insulating layer 48 that covers the source 42, the drain 43, the insulating film 44, the floating gate 45, the insulating film 46 and the control gate 47. The insulating layer 48 has contact holes that open at the tops of the source 42, the drain 43 and the control gate 47, respectively. The memory cell 40 includes a source electrode 52, a drain electrode 53, and a control gate electrode 57 that are formed on the insulating layer 48 at locations above the source 42, the drain 43 and the control gate 47, respectively. The source electrode 52, the drain electrode 53 and the control gate electrode 57 are connected to the source 42, the drain 43 and the control gate 47, respectively, through the corresponding contact holes.

A manufacturing method for the layered chip package 1 according to the present embodiment will now be described. The manufacturing method for the layered chip package 1 according to the present embodiment includes the steps of fabricating a plurality of substructures each of which includes a plurality of preliminary layer portions arrayed, each of the preliminary layer portions being intended to be made into any one of the plurality of layer portions 10, the substructures being intended to be cut later at the position of the boundary between every adjacent two of the preliminary layer portions; and fabricating the layered chip package 1 by using the plurality of substructures.

The step of fabricating the plurality of substructures includes the steps of fabricating a pre-substructure wafer that includes a plurality of pre-semiconductor-chip portions arrayed; distinguishing the plurality of pre-semiconductor-chip portions included in the pre-substructure wafer into normally functioning pre-semiconductor-chip portions and malfunctioning pre-semiconductor-chip portions; and forming the plurality of wires 26 in the normally functioning pre-semiconductor-chip portions while not forming the plurality of wires 26 in the malfunctioning pre-semiconductor-chip portions, so as to make the pre-substructure wafer into one substructure.

With reference to FIG. 9 to FIG. 17C, a detailed description will now be given of the step of fabricating the plurality of substructures in the manufacturing method for the layered chip package 1 according to the present embodiment.

Figure 9:
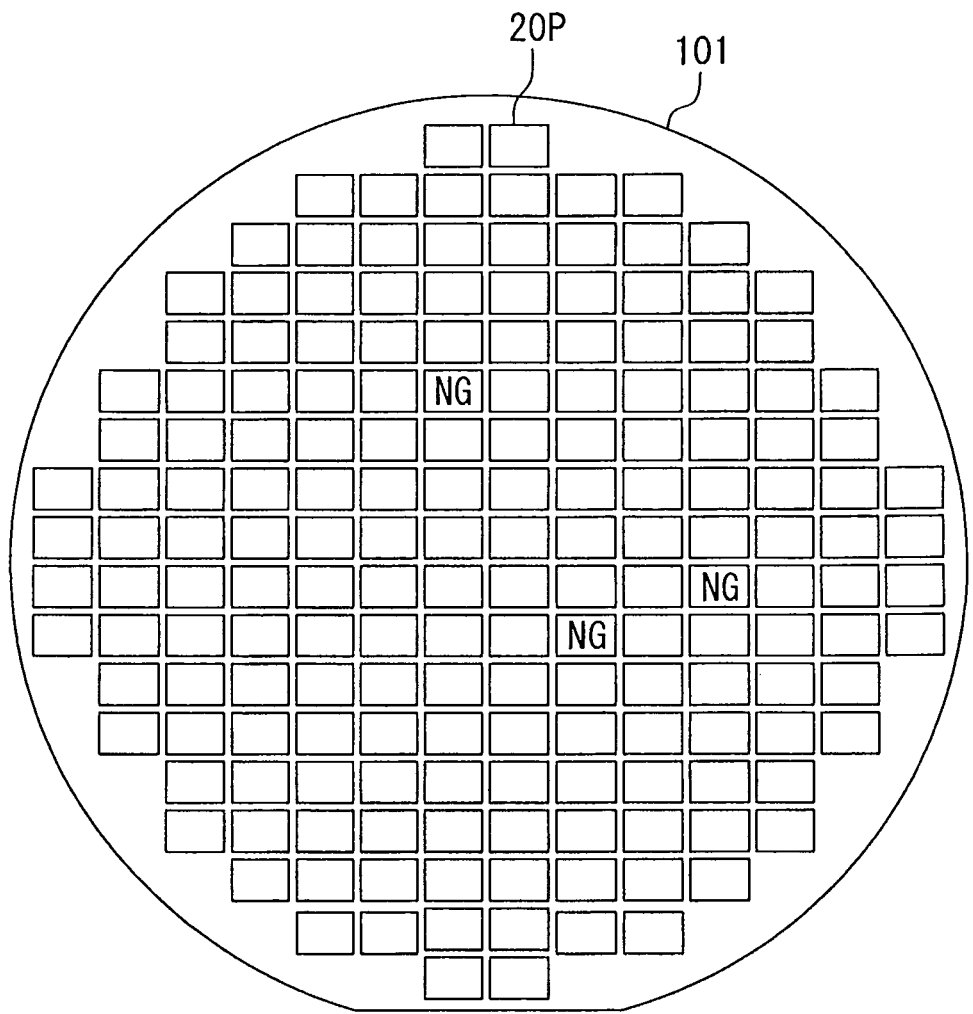
FIG. 9 is a plan view showing a pre-substructure wafer of the first embodiment of the invention.

FIG. 9 is a plan view showing the pre-substructure wafer. In the step of fabricating the pre-substructure wafer, a pre-substructure wafer 101 as shown in FIG. 9 is fabricated. The pre-substructure wafer 101 includes a plurality of pre-semiconductor-chip portions 20P arrayed. Specifically, in this step, a semiconductor wafer having two surfaces that face toward opposite directions is subjected to processing, such as a wafer process, at one of the two surfaces. The pre-substructure wafer 101 including the plurality of pre-semiconductor-chip portions 20P arrayed is thereby fabricated. The plurality of pre-semiconductor-chip portions 20P each include the circuit 22, and are to be made into a plurality of semiconductor chips 20 later. The plurality of pre-semiconductor-chip portions 20P of the pre-substructure wafer 101 may be made into a plurality of semiconductor chips 20 of the same type later. In the pre-substructure wafer 101, the plurality of pre-semiconductor-chip portions 20P may be arrayed in a row, or in a plurality of rows such that a number of pre-semiconductor-chip portions 20P are arrayed both in vertical and horizontal directions. The semiconductor wafer may be a silicon wafer, for example. The wafer process is a process in which a semiconductor wafer is processed into a plurality of devices that are not yet separated into a plurality of chips.

Figure 10:
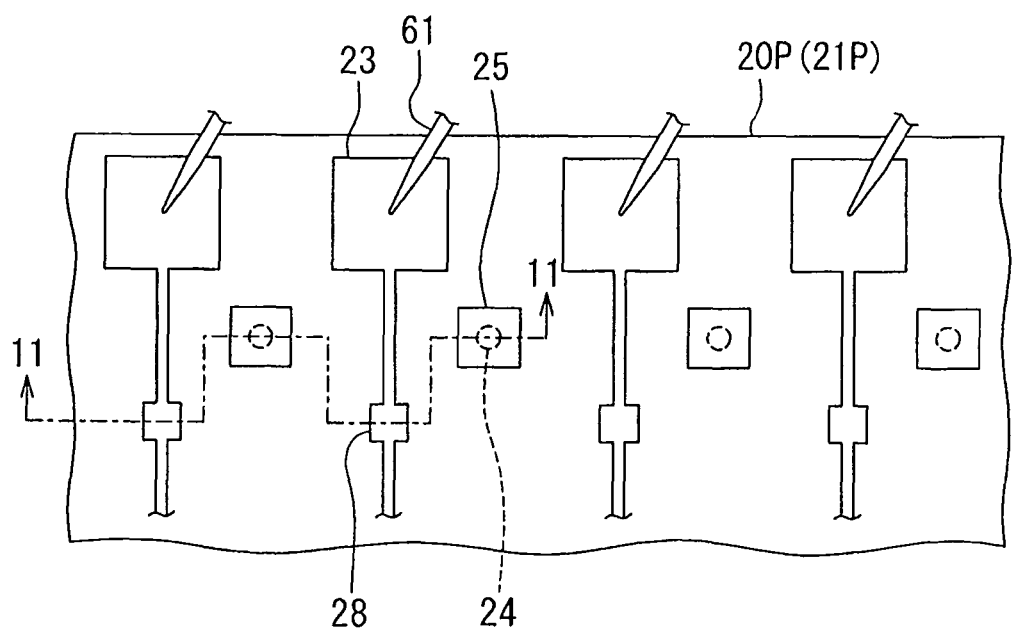
FIG. 10 is an explanatory diagram showing a step of a manufacturing method for the layered chip package according to the first embodiment of the invention.
Figure 11:
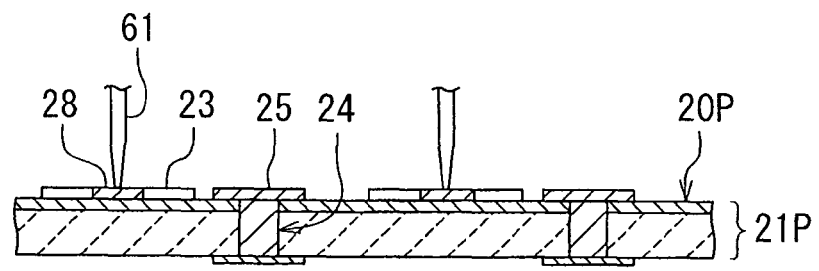
FIG. 11 shows a cross section taken along line 11-11 of FIG. 10.

FIG. 10 shows a part of the top surface of each pre-semiconductor-chip portion 20P. FIG. 11 shows a cross section taken along line 11-11 of FIG. 10. As shown in FIG. 10 and FIG. 11, each pre-semiconductor-chip portion 20P includes a pre-chip-body portion 21P, and the plurality of electrode pads 23, through electrodes 24, auxiliary pads 25, leads 27, and second auxiliary pads 28. The pre-chip-body portion 21P includes the circuit 22 and is to be made into the chip body 21 later.

After the step of fabricating the pre-substructure wafer 101, a wafer sort test is performed to distinguish the plurality of pre-semiconductor-chip portions 20P included in the pre-substructure wafer 101 into normally functioning pre-semiconductor-chip portions 20P and malfunctioning pre-semiconductor-chip portions 20P. In this step, as shown in FIG. 10 and FIG. 11, a probe 61 of a testing device is brought into contact with the plurality of electrode pads 23 of each pre-semiconductor-chip portion 20P so that whether the pre-semiconductor-chip portion 20P functions normally or not is tested with the testing device. In FIG. 9, the pre-semiconductor-chip portions 20P marked with "NG" are malfunctioning ones, and the other pre-semiconductor-chip portions 20P are normally functioning ones. This step provides location information on the normally functioning pre-semiconductor-chip portions 20P and the malfunctioning pre-semiconductor-chip portions 20P in each pre-substructure wafer 101. The location information is used in an exposure step for forming a frame to be described later.

Figure 12:
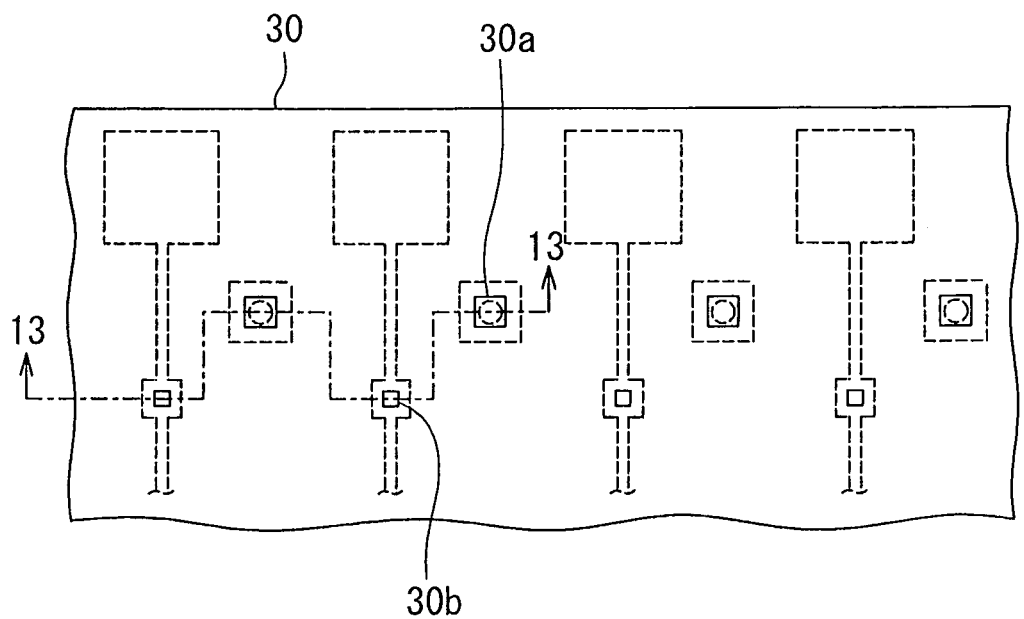
FIG. 12 is an explanatory diagram showing a step that follows the step of FIG. 10.
Figure 13:
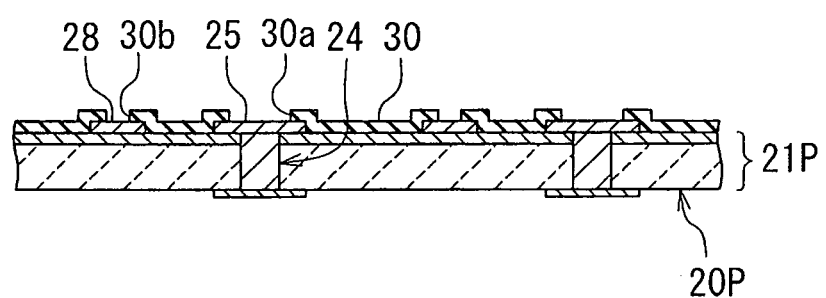
FIG. 13 shows a cross section taken along line 13-13 of FIG. 12.

FIG. 12 and FIG. 13 show the next step. FIG. 12 is an explanatory diagram showing a step that follows the step of FIG. 10. FIG. 13 shows a cross section taken along line 13-13 of FIG. 12. In this step, first, the insulating film 30 is formed to cover the entire top surface of the pre-substructure wafer 101. Next, a plurality of openings 30a for exposing the top surfaces of the auxiliary pads 25 and a plurality of openings 30b for exposing the top surfaces of the second auxiliary pads 28 are formed in the insulating film 30.

Next, performed is the step of forming the plurality of wires 26 in the normally functioning pre-semiconductor-chip portions 20P while not forming the plurality of wires 26 in the malfunctioning pre-semiconductor-chip portions 20P. This step includes the steps of forming a photoresist layer that is intended to be used for forming the plurality of wires 26 per pre-semiconductor-chip portion 20P and includes a plurality of areas corresponding to all the pre-semiconductor-chip portions 20P; forming a frame by patterning the photoresist layer by photolithography, the frame having a plurality of openings for the wires to accommodate the plurality of wires 26 later, the openings for the wires being formed in areas of the photoresist layer that correspond to the normally functioning pre-semiconductor-chip portions 20P; and forming the plurality of wires 26 so that they are accommodated in the plurality of openings for the wires in the frame.

The step of forming the frame includes forming a plurality of openings for the connecting parts in areas of the photoresist layer that correspond to the malfunctioning pre-semiconductor-chip portions 20P, the openings for the connecting parts being intended to accommodate the plurality of connecting parts 29 later. The step of fabricating the substructures further includes the step of forming the plurality of connecting parts 29 so that they are accommodated in the plurality of openings for the connecting parts in the frame. The step of forming the plurality of connecting parts 29 may be performed simultaneously with the step of forming the plurality of wires 26.

Figure 14:
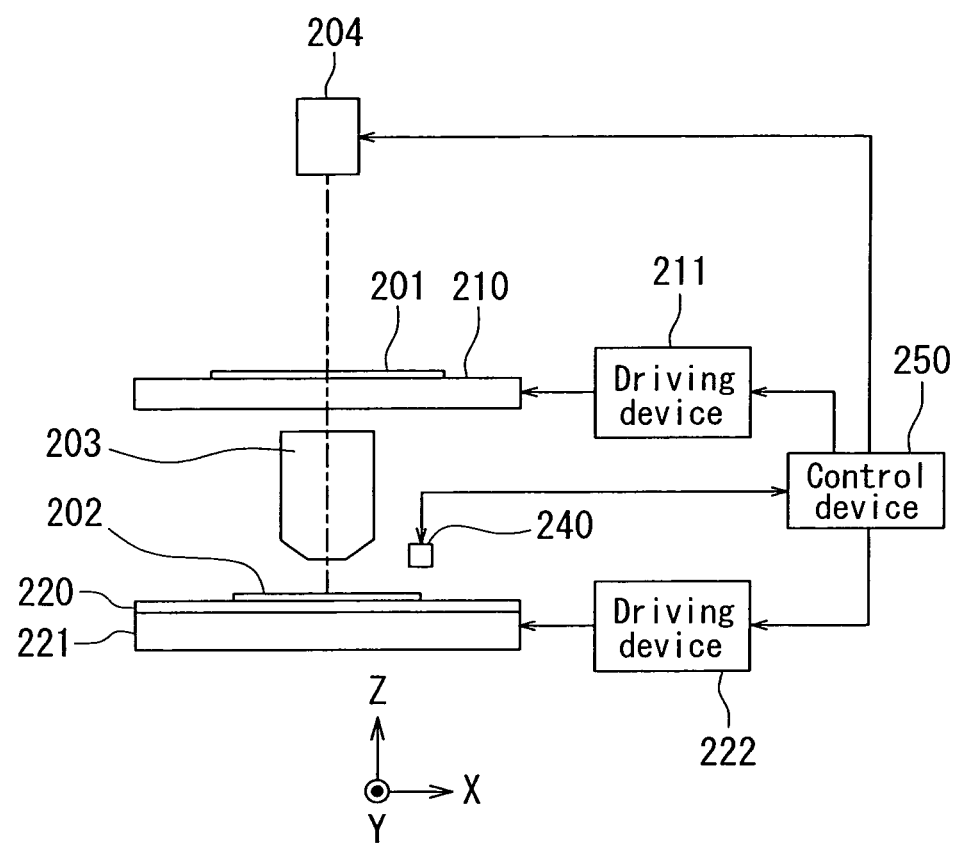
FIG. 14 is an explanatory diagram showing an example of the configuration of an exposure apparatus for use in the manufacturing method for the layered chip package according to the first embodiment of the invention.

Reference is now made to FIG. 14 to describe an example of the configuration of an exposure apparatus for use in the step of forming the frame. The exposure apparatus shown in FIG. 14 is a stepping projection exposure apparatus, or a so-called stepper. The exposure apparatus includes: a mask stage 210 for retaining a mask 201; a driving device 211 for driving the mask stage 210 to move or replace the mask 201; a wafer stage 220 for retaining a wafer 202; a moving mechanism 221 for moving the wafer stage 220; a driving device 222 for driving the moving mechanism 221; a reduction projection optical system 203; an illumination device 204; a detection device 240 for detecting the location of the wafer 202; and a control device 250 for controlling the illumination device 204, the driving devices 211 and 222 and the detection device 240.

The mask stage 210 is disposed above the wafer stage 220. The reduction projection optical system 203 is disposed between the mask stage 210 and the wafer stage 220. The illumination device 204 is disposed above the mask stage 210 and applies light for exposure to the mask 201.

The moving mechanism 221 is capable of moving the wafer stage 220 in X, Y and Z directions shown in FIG. 14 and capable of changing the angle of inclination of the wafer stage 220 with respect to the X-Y plane. The X direction and the Y direction are orthogonal to each other and are both orthogonal to the direction of the optical axis of the reduction projection optical system 203. The Z direction is parallel to the direction of the optical axis of the reduction projection optical system 203. The detection device 240 detects the location of the surface of the wafer 202 and the angle of inclination of the surface of the wafer 202 with respect to the X-Y plane.

The control device 250 has a microprocessor unit (MPU), read only memory (ROM) and random access memory (RAM).

To expose the wafer 202 to light using this exposure apparatus, a plurality of pattern projection regions are defined on the surface of the wafer 202. A ray bundle emitted from the illumination device 204 passes through the mask 201 and is applied to one of the pattern projection regions by the reduction projection optical system 203. The mask pattern of the mask 201 is thereby projected onto the one of the pattern projection regions via the reduction projection optical system 203 so as to perform the process of exposing the one of the pattern projection regions. After performing the process of exposing the one of the pattern projection regions based on the mask pattern, the exposure apparatus moves the wafer 202 in the X or Y direction, and performs the same exposure process for a next one of the pattern projection regions.

Figure 15:
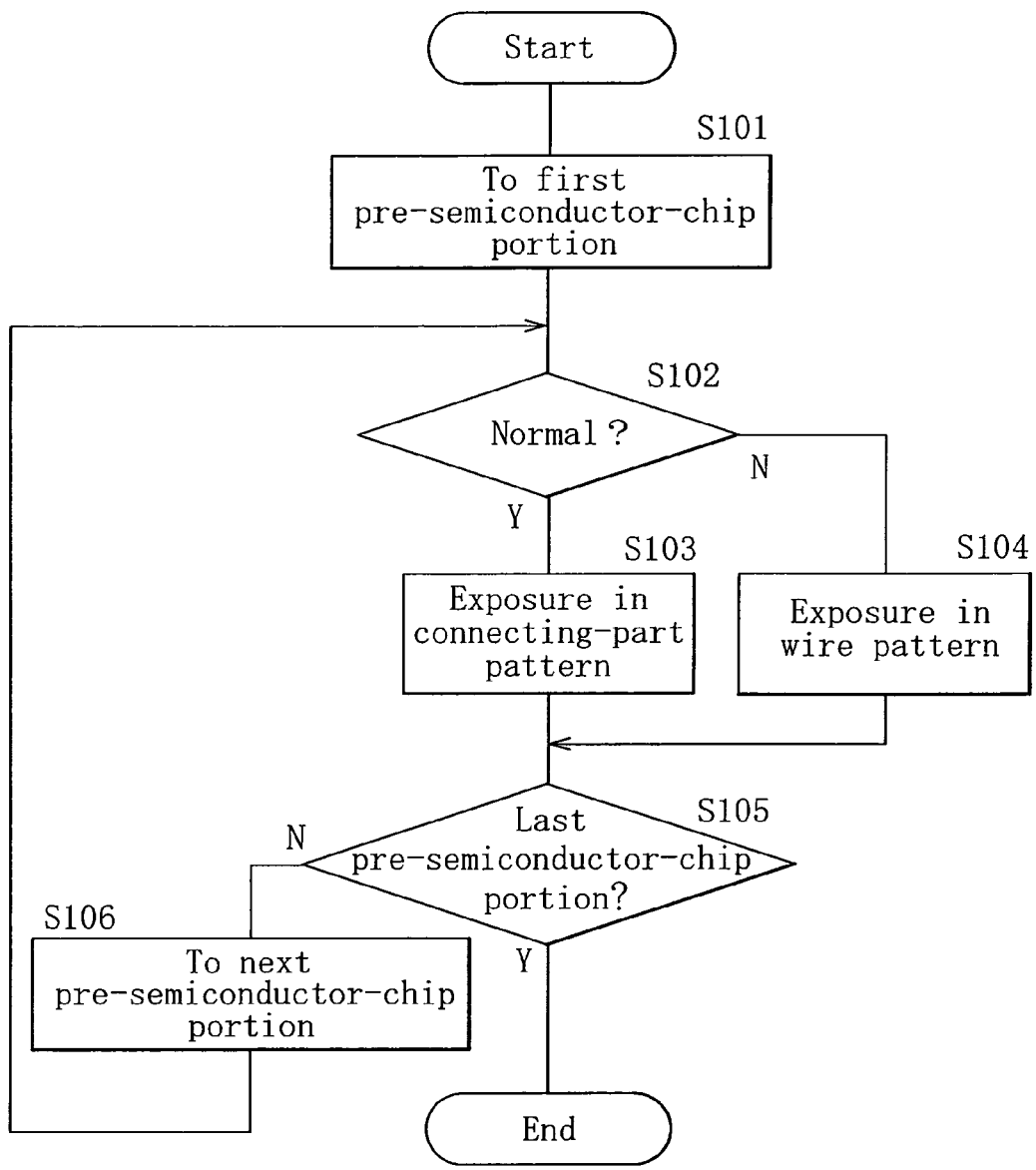
FIG. 15 is a flow chart showing an exposure step for forming wires in the manufacturing method for the layered chip package according to the first embodiment of the invention.

Next, with reference to the flowchart of FIG. 15, a description will be given of the step of exposing the photoresist layer to light in order to form the frame to be used for forming the plurality of wires 26 and the plurality of connecting parts 29. The following description will be given for situations where the photoresist layer is of negative type. The photoresist layer of negative type is soluble in a developing solution for the portions unirradiated with light, and becomes insoluble in the developing solution for the portions irradiated with light.

In this exposure step, the photoresist layer is exposed to light so that a latent image corresponding to the plurality of wires 26 is formed in the areas of the photoresist layer that correspond to the normally functioning pre-semiconductor-chip portions 20P and a latent image corresponding to the connecting parts 29 is formed in the areas of the photoresist layer that correspond to the malfunctioning pre-semiconductor-chip portions 20P. In this exposure step, first, among the plurality of pattern projection regions corresponding to the plurality of pre-semiconductor-chip portions 20P, a pattern projection region corresponding to a first pre-semiconductor-chip portion 20P is selected to be exposed by the exposure apparatus of FIG. 14 (Step S101). Next, the control device 250 judges whether the pre-semiconductor-chip portion 20P corresponding to the selected pattern projection region is a normally functioning one or not (Step S102).

If the pre-semiconductor-chip portion 20P is judged as a normally functioning one (Y) in Step S102, the area of the photoresist layer corresponding to the normally functioning pre-semiconductor-chip portion 20P is exposed to light in a pattern corresponding to the plurality of wires 26 (hereinafter referred to as a wire pattern) by using a mask 201 that has the wire pattern (hereinafter referred to as mask 201A) (Step S103). Specifically, the wire pattern is such a pattern that the parts of the pattern projection region where to form the openings to accommodate the wires 26 later are not irradiated with light while the other parts of the pattern projection region are irradiated with light. As a result of this exposure, the latent image corresponding to the plurality of wires 26 is formed in the area of the photoresist layer corresponding to the normally functioning pre-semiconductor-chip portion 20P. To be more specific, after this exposure, the area of the photoresist layer corresponding to the normally functioning pre-semiconductor-chip portion 20P remains soluble in the developing solution for the parts where to form the openings to accommodate the wires 26 later, and becomes insoluble in the developing solution for the other parts.

If the pre-semiconductor-chip portion 20P is judged as a malfunctioning one (N) in Step S102, the area of the photoresist layer corresponding to the malfunctioning pre-semiconductor-chip portion 20P is exposed to light in a pattern corresponding to the plurality of connecting parts 29 (hereinafter referred to as a connecting-part pattern) by using a mask 201 that has the connecting-part pattern (hereinafter referred to as mask 201B) (Step S104). Specifically, the connecting-part pattern is such a pattern that the parts of the pattern projection region where to form the openings to accommodate the connecting parts 29 later are not irradiated with light while the other parts of the pattern projection region are irradiated with light. As a result of this exposure, the latent image corresponding to the plurality of connecting parts 29 is formed in the area of the photoresist layer corresponding to the malfunctioning pre-semiconductor-chip portion 20P. To be more specific, after this exposure, the area of the photoresist layer corresponding to the malfunctioning pre-semiconductor-chip portion 20P remains soluble in the developing solution in the parts where to form the openings to accommodate the connecting parts 29 later, and becomes insoluble in the developing solution in the other parts.

After Step S103 or S104 is performed, the control device 250 judges whether the pattern projection region that has undergone the exposure in Step S103 or S104 is the region corresponding to the last pre-semiconductor-chip portion 20P or not (Step S105). If the pattern projection region is judged as corresponding to the last pre-semiconductor-chip portion 20P (Y), the exposure step ends. If the pattern projection region is judged as not corresponding to the last pre-semiconductor-chip portion 20P (N), a pattern projection region corresponding to a next pre-semiconductor-chip portion 20P is selected to be exposed (Step S106) and the process is repeated from Step S102.

The location information on the normally functioning pre-semiconductor-chip portions 20P and the malfunctioning pre-semiconductor-chip portions 20P in each pre-substructure wafer 101 obtained by the distinguishing step is input to and held by the control device 250 when exposing the photoresist layer. The control device 250 can replace the masks 201A and 201B with each other based on the location information.

Figure 16A:
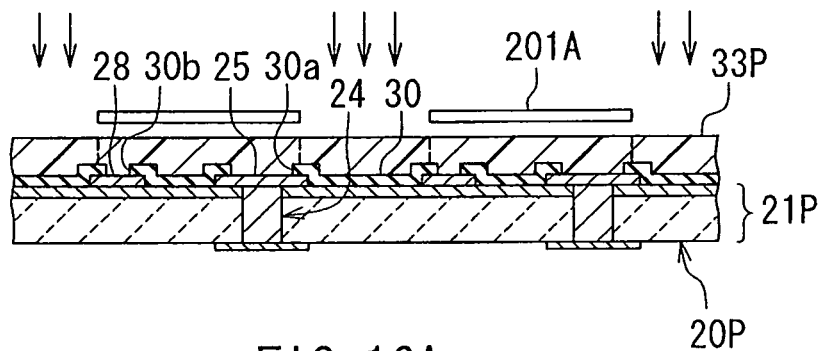
FIG. 16A to FIG. 16C are explanatory diagrams showing a step that follows the step of FIG. 13, intended for normally functioning pre-semiconductor-chip portions.

Next, with reference to FIG. 16A to FIG. 16C, a description will be given of a step that follows the step of FIG. 13, intended for the normally functioning pre-semiconductor-chip portions 20P. In this step, as shown in FIG. 16A, a photoresist layer 33P for forming the frame is initially formed so as to cover the pre-semiconductor-chip portion 20P shown in FIG. 13. Next, in Step S103 of FIG. 15, the photoresist layer 33P is exposed in the wire pattern by using the mask 201A.

Figure 16B:
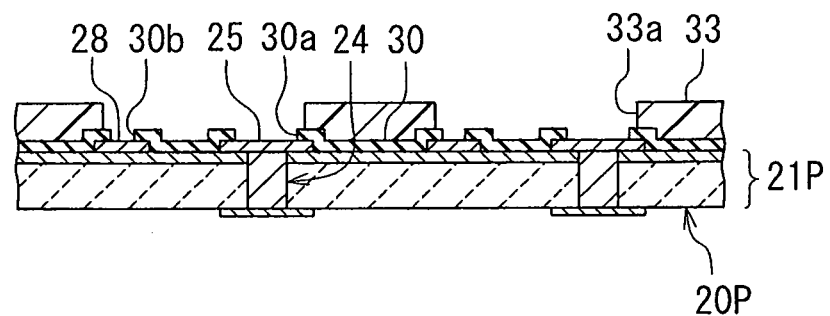

Next, as shown in FIG. 16B, the photoresist layer 33P is developed with the developing solution. This completes the frame 33. In the normally functioning pre-semiconductor-chip portions 20P, the frame 33 has a plurality of openings 33a for the wires.

Figure 16C:
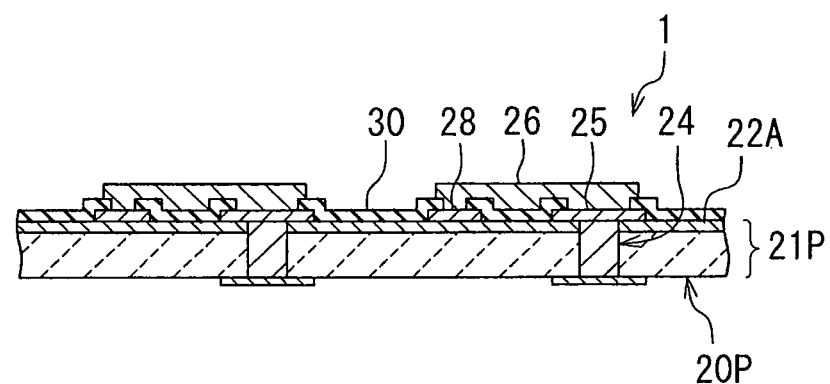

Next, as shown in FIG. 16C, the plurality of wires 26 are formed by, for example, plating, so that they are accommodated in the plurality of openings 33a for the wires in the frame 33. The frame 33 is then removed.

Figure 17A:
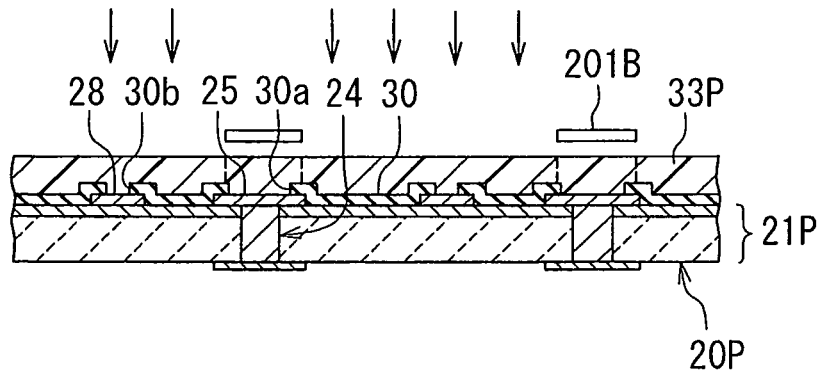
FIG. 17A to FIG. 17C are explanatory diagrams showing a step that follows the step of FIG. 13, intended for malfunctioning pre-semiconductor-chip portions.

Next, with reference to FIG. 17A to FIG. 17C, a description will be given of a step that follows the step of FIG. 13, intended for the malfunctioning pre-semiconductor-chip portions 20P. In this step, as shown in FIG. 17A, the photoresist layer 33P for forming the frame is initially formed so as to cover the pre-semiconductor-chip portion 20P shown in FIG. 13. This step is performed simultaneously with the step shown in FIG. 16A where the photoresist layer 33P is formed to cover the normally functioning pre-semiconductor-chip portion 20P. Next, in Step S104 of FIG. 15, the photoresist layer 33P is exposed in the connecting-part pattern by using the mask 201B.

Figure 17B:
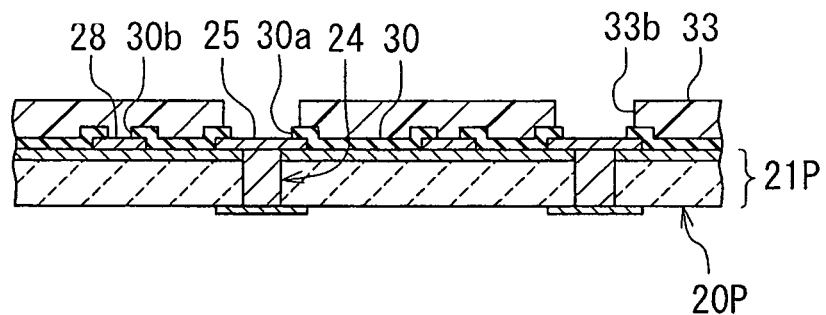

Next, as shown in FIG. 17B, the photoresist layer 33P is developed with the developing solution. This completes the frame 33. In the malfunctioning pre-semiconductor-chip portions 20P, the frame 33 has a plurality of openings 33b for the connecting parts. The step shown in FIG. 17B is performed simultaneously with the step shown in FIG. 16B.

Figure 17C:
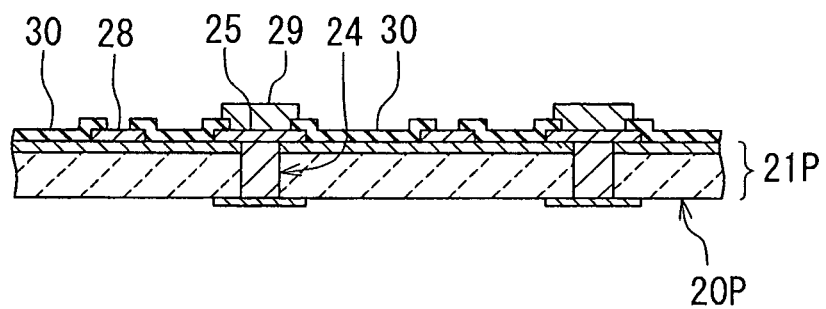

Next, as shown in FIG. 17C, the plurality of connecting parts 29 are formed by, for example, plating, so that they are accommodated in the plurality of openings 33b for the connecting parts in the frame 33. The frame 33 is then removed. The step shown in FIG. 17C is performed simultaneously with the step shown in FIG. 16C.

Through the series of steps described so far, there is provided a substructure in which the plurality of wires 26 are formed in each of the normally functioning pre-semiconductor-chip portions 20P and the plurality of connecting parts 29 are formed in each of the malfunctioning pre-semiconductor-chip portions 20P. The same series of steps can be repeated to obtain a plurality of substructures.

Figure 18:
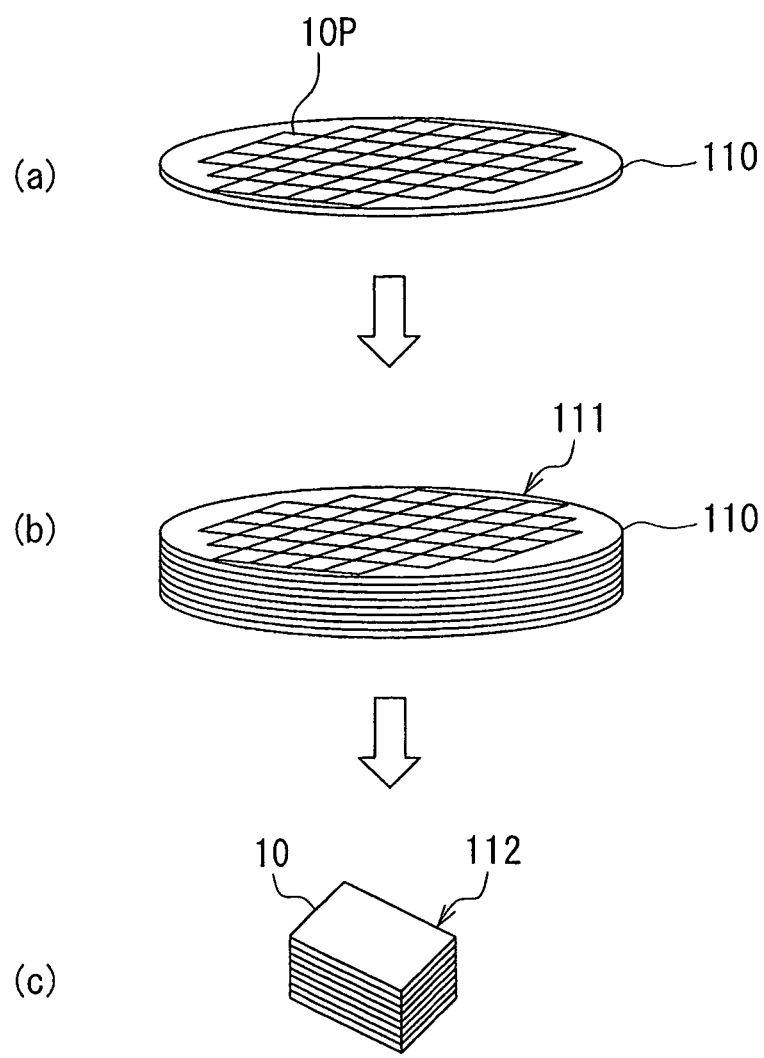
FIG. 18 is an explanatory diagram showing the step of fabricating the layered chip package by using a plurality of substructures in the first embodiment of the invention.

Next, with reference to FIG. 18, the step of fabricating the layered chip package 1 by using a plurality of substructures will be described in detail. Portion (a) of FIG. 18 shows one substructure 110. The substructure 110 includes a plurality of preliminary layer portions 10P arrayed. The substructure 110 is to be cut later at the positions of the boundaries between every adjacent preliminary layer portions 10P. The preliminary layer portions 10P are obtained by subjecting the pre-semiconductor-chip portions 20P to the processing of the steps shown in FIG. 16A to FIG. 16C or the steps shown in FIG. 17A to FIG. 17C.

In the step of fabricating the layered chip package 1, as shown in portion (b) of FIG. 18, a layered substructure 111 is initially fabricated by stacking a predetermined number of substructures 110. Portion (b) of FIG. 18 shows an example where the predetermined number is eight. When fabricating the layered substructure 111, the plurality of wires 26 or connecting parts 29 of a lower one of every two preliminary layer portions 10P to be vertically adjacent to each other are bonded to the conductor films 24b of the respective corresponding through electrodes 24 of the upper one of the two preliminary layer portions 10P electrically and physically. The bonding is achieved by soldering, for example.

In the step of fabricating the layered chip package 1, the layered substructure 111 is then cut at the positions of the boundaries between every adjacent preliminary layer portions 10P in each substructure 110. A stack 112 shown in portion (c) of FIG. 18 is thereby obtained. Here, the pre-semiconductor-chip portions 20P become semiconductor chips 20, and the preliminary layer portions 10P become layer portions 10. The stack 112 has a plurality of layer portions 10 stacked which are as many as the foregoing predetermined number.

If all the plurality of layer portions 10 included in the stack 112 are the first-type layer portions 10A, a plurality of external terminals 2 are formed on the bottom surface of the chip body 21 in the lowermost layer portion 10 of the stack 112 to complete a layered chip package 1. The plurality of external terminals 2 are formed by soldering, for example.

If all the plurality of layer portions 10 included in the stack 112 are the second-type layer portions 10B, the stack 112 is not used to fabricate a layered chip package 1.

If the stack 112 includes one or more first-type layer portions 10A and one or more second-type layer portions 10B, a plurality of external terminals 2 may be formed on the bottom surface of the chip body 21 in the lowermost layer portion 10 of the stack 112 to complete a layered chip package 1. In such a case, the layered chip package 1 makes a product that includes fewer first-type layer portions 10A than the foregoing predetermined number.

In the case where the stack 112 includes one or more first-type layer portions 10A and one or more second-type layer portions 10B, one or more additional first-type layer portions 10A as many as the number of the second-type layer portion(s) 10B included in the stack 112 may be stacked together with the stack 112 into a new stack. Then, a plurality of external terminals 2 may be formed on the bottom surface of the chip body 21 in the lowermost layer portion 10 of the new stack to complete a layered chip package 1. In this case, the resulting layered chip package 1 includes the foregoing predetermined number of first-type layer portions 10A. Such a layered chip package 1 provides the same functions as those of a layered chip package 1 that does not include any second-type layer portion 10B.

The layered chip package 1 shown in FIG. 6 is fabricated as described above. More specifically, this layered chip package 1 is fabricated using a new stack that is formed by stacking one additional first-type layer portion 10A together with the stack 112 that includes eight layer portions 10, one of which is a second-type layer portion 10B. Any additional first-type layer portions 10A are obtained by cutting the substructure 110 at the positions of the boundaries between adjacent preliminary layer portions 10P.

Note that the layered chip package 1 need not necessarily be provided with the plurality of external terminals 2. The conductor films 24b of the plurality of through electrodes 24 in the lowermost layer portion 10 may be used as external terminals instead. Alternatively, a substrate having a plurality of external terminals may be bonded to the bottom surface of the lowermost layer portion 10 so that the plurality of through electrodes 24 in the lowermost layer portion 10 are electrically connected to the plurality of external terminals.

In the layered chip package 1, the plurality of wires 26 or the plurality of connecting parts 29 of the uppermost layer portion 10 may also be used as external terminals. Alternatively, an insulating layer may be formed to cover the top surface of the uppermost layer portion 10, and a plurality of openings for exposing the plurality of wires 26 or connecting parts 29 may be formed in the insulating layer. Then, a plurality of external terminals electrically connected to the wires 26 or connecting parts 29 may be formed in the respective plurality of openings.

As has been described, in the layered chip package 1 according to the present embodiment, the second-type layer portion 10B which includes a defective semiconductor chip 20 does not have the plurality of wires 26 which electrically connect the plurality of through electrodes 24 to the respective corresponding electrode pads 23. In the second-type layer portion 10B, the plurality of through electrodes 24 are therefore electrically connected to neither the circuit 22 nor the plurality of electrode pads 23. The circuit 22 in the defective semiconductor chip 20 of the second-type layer portion 10B is thus electrically isolated inside the layered chip package 1, being electrically connected to neither the circuits 22 of the conforming semiconductor chips 20 of the first-type layer portions 10A nor the plurality of external terminals 2. The present embodiment thus makes it possible to disable the use of defective semiconductor chips 20 while reducing the problems attributable to the circuits 22 in the defective semiconductor chips 20 (the occurrence of unnecessary capacitances and unnecessary inductances).

In the manufacturing method for the layered chip package 1 according to the present embodiment, the plurality of pre-semiconductor-chip portions 20P included in the pre-substructure wafer 101 are distinguished into normally functioning pre-semiconductor-chip portions 20P and malfunctioning pre-semiconductor-chip portions 20P. The plurality of wires 26 are formed in the normally functioning pre-semiconductor-chip portions 20P, while the plurality of connecting parts 29, instead of the wires 26, are formed in the malfunctioning pre-semiconductor-chip portions 20P. Such a manufacturing method of the present embodiment simplifies the manufacturing process of the layered chip package 1 that provides the foregoing advantageous effects.

[Second Embodiment]

Figure 19:
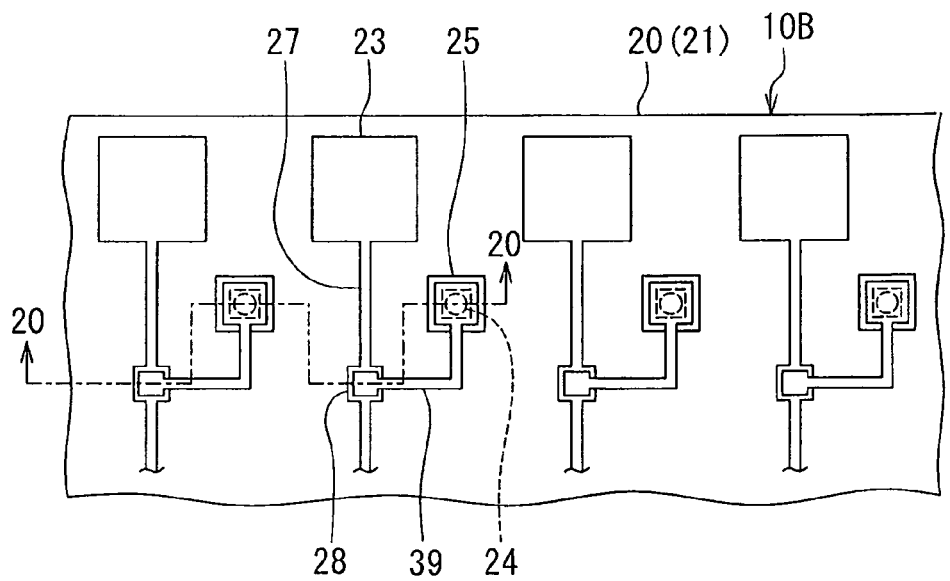
FIG. 19 is a plan view showing a part of the second-type layer portion of a second embodiment of the invention.
Figure 20:
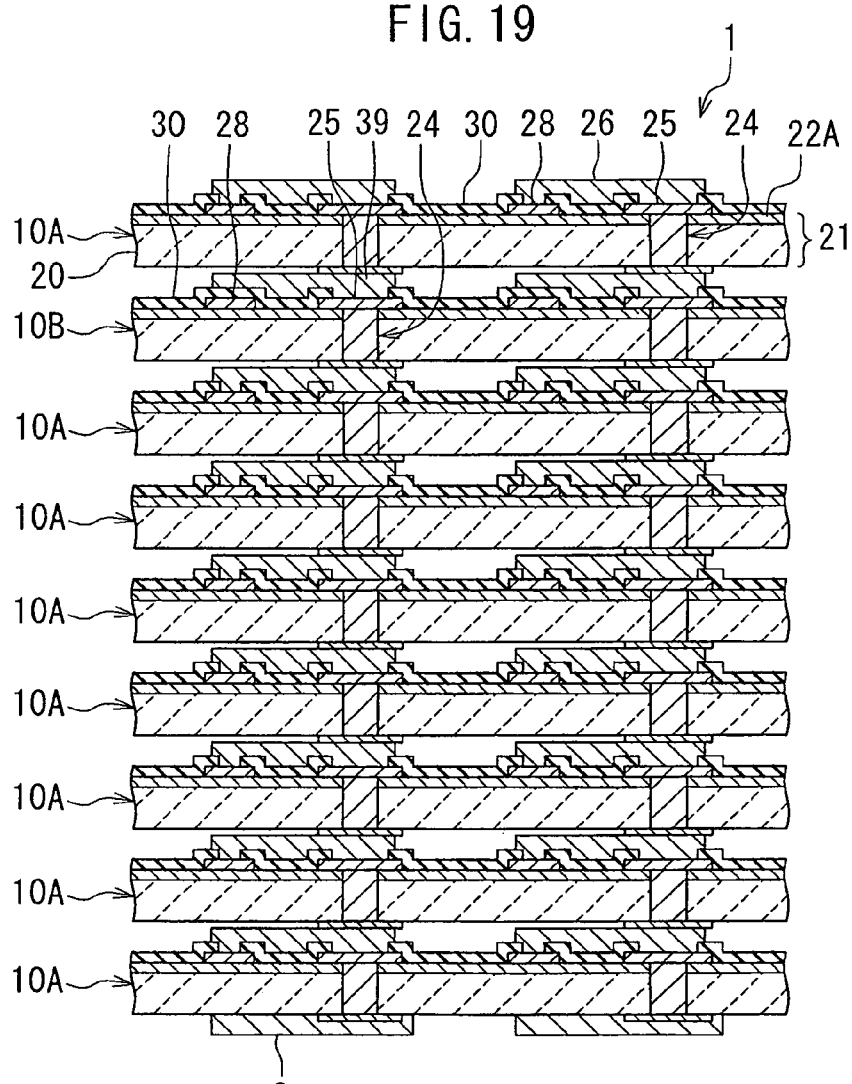
FIG. 20 is a cross-sectional view showing a part of a layered chip package according to the second embodiment of the invention.

A layered chip package 1 and its manufacturing method according to a second embodiment of the invention will now be described. Reference is now made to FIG. 19 and FIG. 20 to describe the configuration of the layered chip package 1 according to the present embodiment. FIG. 19 is a plan view showing a part of the second-type layer portion 10B. FIG. 20 is a cross-sectional view showing a part of the layered chip package 1 that includes the first-type layer portion 10A and the second-type layer portion 10B. The cross section of the second-type layer portion 10B shown in FIG. 20 is taken along line 20-20 of FIG. 19. The cross section of the first-type layer portions 10A shown in FIG. 20 is taken along line 4-4 of FIG. 3.

In the layered chip package 1 according to the present embodiment, the first-type layer portion 10A has the same configuration as in the first embodiment. The second-type layer portion 10B of the present embodiment includes a plurality of connecting parts 39 instead of the plurality of connecting parts 29 of the first embodiment. In the second-type layer portions 10B, the insulating film 30 has a plurality of openings for exposing the top surfaces of the plurality of auxiliary pads 25, but does not have openings for exposing the top surfaces of the second auxiliary pads 28. The connecting parts 39 are arranged on the insulating film 30, and are in contact with the top surfaces of the auxiliary pads 25 through the openings above the top surfaces of the auxiliary pads 25. The connecting parts 39 are thereby electrically and physically connected to the auxiliary pads 25.

As seen from above, the connecting parts 39 (see FIG. 19) have the same shape as that of the wires 26 (see FIG. 3). As mentioned above, however, in the second-type layer portion 10B of the present embodiment, the insulating film 30 does not have the openings for exposing the top surfaces of the plurality of second auxiliary pads 28. The plurality of connecting parts 39 are therefore not electrically connected to the plurality of second auxiliary pads 28. In the second-type layer portion 10B, the plurality of through electrodes 24 are therefore electrically connected to neither the circuit 22 nor the plurality of electrode pads 23. The plurality of connecting parts 39 are used for electrically connecting the through electrodes 24 of the semiconductor chip 20 of one of two vertically adjacent layer portions 10 to the respective corresponding through electrodes 24 of the semiconductor chip 20 of the other of the two vertically adjacent layer portions 10.

In the layered chip package 1 shown in FIG. 20, the plurality of through electrodes 24 of the semiconductor chip 20 of the second-type layer portion 10B are electrically connected to the respective corresponding through electrodes 24 of the semiconductor chip 20 of the upper layer portion 10 via the corresponding auxiliary pads 25 and connecting parts 39.

For the sake of convenience, FIG. 20 shows the wires 26 as if they are continuous irrespective of the position of the line 4-4, and shows the connecting parts 39 as if they are continuous irrespective of the position of the line 20-20.

Now, a manufacturing method for the layered chip package 1 according to the present embodiment will be described with reference to FIG. 21 to FIG. 23C. The manufacturing method of the present embodiment has the same steps as those of the method of the first embodiment up to the step of forming the insulating film 30 prior to the formation of the openings.

Figure 21:
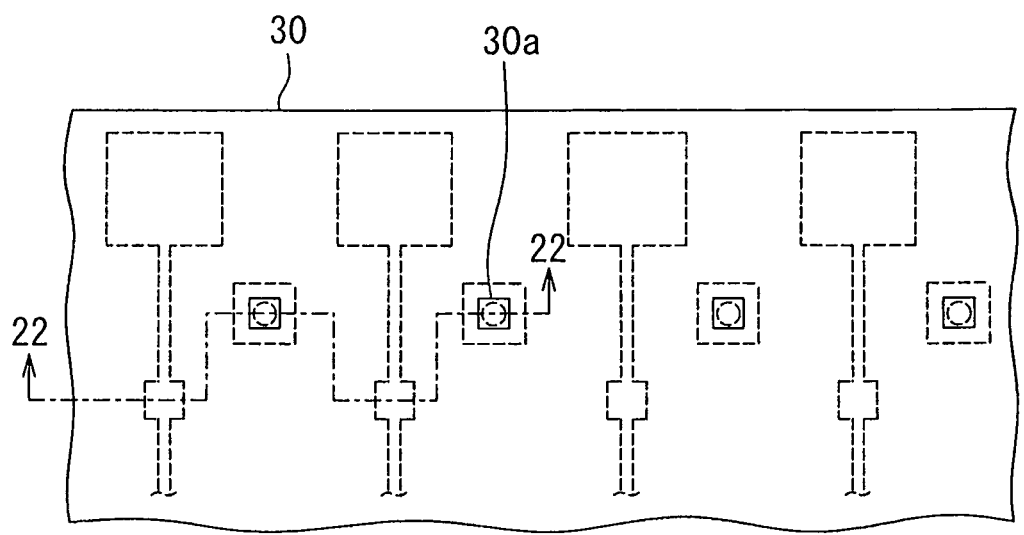
FIG. 21 is an explanatory diagram showing a step of a manufacturing method for the layered chip package according to the second embodiment of the invention.
Figure 22:
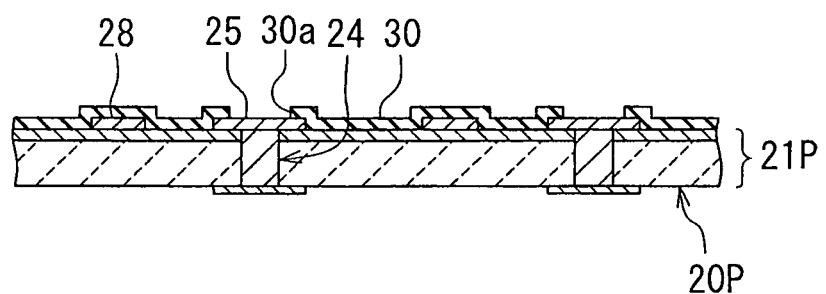
FIG. 22 shows a cross section taken along line 22-22 of FIG. 21.

Then, for the normally functioning pre-semiconductor-chip portions 20P, a plurality of openings 30a for exposing the top surfaces of the auxiliary pads 25 and a plurality of openings 30b for exposing the top surfaces of the second auxiliary pads 28 are formed in the insulating film 30 as shown in FIG. 12 and FIG. 13. FIG. 21 is an explanatory diagram showing a step that follows the step of FIG. 10, intended for the malfunctioning pre-semiconductor-chip portions 20P. FIG. 22 shows a cross section taken along line 22-22 of FIG. 21. For the malfunctioning pre-semiconductor-chip portions 20P, as shown in FIG. 21 and FIG. 22, the plurality of openings 30a for exposing the top surfaces of the auxiliary pads 25 are formed in the insulating film 30, but the plurality of openings 30b for exposing the top surfaces of the second auxiliary pads 28 are not formed. The step of forming the openings 30a, 30b in the insulating film 30 uses the location information on the normally functioning pre-semiconductor-chip portions 20P and the malfunctioning pre-semiconductor-chip portions 20P obtained by the distinguishing step.

Next, for the normally functioning pre-semiconductor-chip portions 20P, the plurality of wires 26 are formed by performing the step shown in FIG. 16A to FIG. 16C, as in the first embodiment.

Figure 23A:
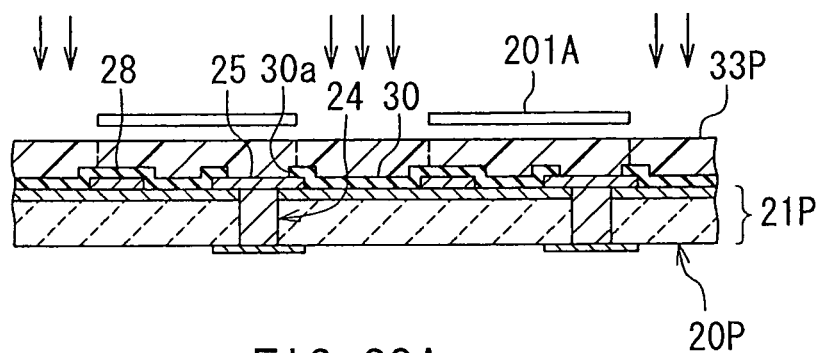
FIG. 23A to FIG. 23C are explanatory diagrams showing a step that follows the step of FIG. 22.
Figure 23B:
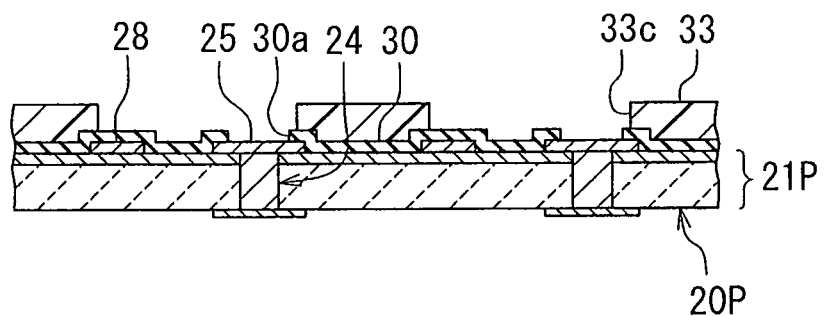
Figure 23C:
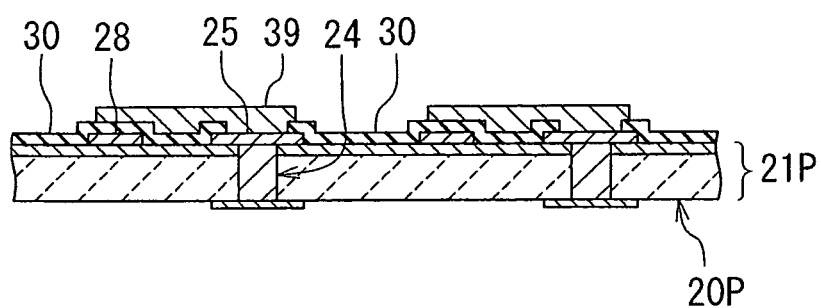

Next, with reference to FIG. 23A to FIG. 23C, a description will be given of a step that follows the step of FIG. 22, intended for the malfunctioning pre-semiconductor-chip portions 20P. The step shown in FIG. 23A to FIG. 23C is the step of forming the plurality of connecting parts 39 instead of the plurality of wires 26. In the present embodiment, since the connecting parts 39 have the same shape as that of the wires 26 as seen from above, the step shown in FIG. 23A to FIG. 23C is substantially the same as the step shown in FIG. 16A to FIG. 16C. In this step, as shown in FIG. 23A, a photoresist layer 33P is initially formed so as to cover the pre-semiconductor-chip portion 20P shown in FIG. 22. Next, the photoresist layer 33P is exposed in the wire pattern by using the mask 201A.

In the present embodiment, it is thus unnecessary to change the mask 201 between the normally functioning pre-semiconductor-chip portion 20P and the malfunctioning pre-semiconductor-chip portion 20P in the exposure step of exposing the photoresist layer 33P for forming the frame.

Next, as shown in FIG. 23B, the photoresist layer 33P is developed with the developing solution. This completes the frame 33. In the malfunctioning pre-semiconductor-chip portions 20P, the frame 33 has a plurality of openings 33c for the connecting parts. The openings 33c for the connecting parts have the same shape as that of the openings 33a for the wires. Note that the step shown in FIG. 23B is performed simultaneously with the step shown in FIG. 16B.

Next, as shown in FIG. 23C, the plurality of connecting parts 39 are formed by, for example, plating, so that they are accommodated in the plurality of openings 33c for the connecting parts in the frame 33. The frame 33 is then removed. The step shown in FIG. 23C is actually performed simultaneously with the step shown in FIG. 16C. In the malfunctioning pre-semiconductor-chip portions 20P, as mentioned previously, the insulating film 30 does not have the plurality of openings 30b for exposing the top surfaces of the plurality of second auxiliary pads 28. The plurality of connecting parts 39 are therefore not electrically connected to the plurality of second auxiliary pads 28.

In this way, there is provided a substructure in which the plurality of wires 26 are formed in each of the normally functioning pre-semiconductor-chip portions 20P and the plurality of connecting parts 39 are formed in each of the malfunctioning pre-semiconductor-chip portions 20P. The same series of steps can be repeated to obtain a plurality of substructures. The subsequent steps of the present embodiment are the same as those of the first embodiment.

The remainder of configuration, function and effects of the present embodiment are similar to those of the first embodiment.

The present invention is not limited to the foregoing embodiments, and various modifications may be made thereto. For example, a photoresist layer of positive type may be used in the exposure step of exposing the photoresist layer for forming the frame to be used to form the plurality of wires and the plurality of connecting parts. In such a case, the light transmitting areas and the light blocking areas of the mask are inverted as compared with the case of using a photoresist layer of negative type.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A layered chip package comprising a plurality of layers that are stacked, wherein:
   at least one of the plurality of layers is a first-type layer and at least another one of the plurality of layers is a second-type layer;
   each of the first-type layer and the second-type layer includes a semiconductor chip;
   the semiconductor chip has a chip body including a circuit, a plurality of electrode pads electrically connected to the circuit, a plurality of through electrodes corresponding to the plurality of electrode pads, and an insulating film that insulates the plurality of through electrodes from the chip body;
   in every vertically adjacent two of the layers, the plurality of through electrodes of the semiconductor chip of one of the two layers are electrically connected to the respective corresponding through electrodes of the semiconductor chip of the other of the two layers;
   the first-type layer includes a plurality of wires for electrically connecting the plurality of through electrodes to the respective corresponding electrode pads; and
   the second-type layer includes no wires to electrically connect the plurality of through electrodes to the respective corresponding electrode pads, thereby the plurality of through electrodes are not connected to the circuit or to the corresponding electrode pads .

2. The layered chip package according to claim 1, wherein the semiconductor chip of the first-type layer is a normally functioning one whereas the semiconductor chip of the second-type layer is a malfunctioning one.

3. The layered chip package according to claim 1, wherein the semiconductor chip further has a plurality of auxiliary pads that are electrically connected to the respective corresponding through electrodes, and the plurality of wires are electrically and physically connected to the respective corresponding auxiliary pads.

4. The layered chip package according to claim 3, wherein the semiconductor chip further has a plurality of second auxiliary pads that are electrically connected to the respective corresponding electrode pads, and the plurality of wires are electrically and physically connected to the respective corresponding second auxiliary pads.

5. The layered chip package according to claim 3, wherein the second-type layer includes a plurality of connecting parts that are not electrically connected to the plurality of electrode pads but are connected to the respective corresponding auxiliary pads electrically and physically, the connecting parts being used for electrically connecting the through electrodes of the semiconductor chip of one of two vertically adjacent layers to the respective corresponding through electrodes of the semiconductor chip of the other of the two vertically adjacent layers.

* * * * *